United States Patent
Nakiboglu

(10) Patent No.: US 10,241,422 B2
(45) Date of Patent: Mar. 26, 2019

(54) LITHOGRAPHY APPARATUS AND A METHOD OF MANUFACTURING A DEVICE

(71) Applicant: ASML NETHERLANDS B.V., Veldhoven (NL)

(72) Inventor: Günes Nakiboglu, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/557,864

(22) PCT Filed: Feb. 16, 2016

(86) PCT No.: PCT/EP2016/053228
§ 371 (c)(1),
(2) Date: Sep. 13, 2017

(87) PCT Pub. No.: WO2016/150622
PCT Pub. Date: Sep. 29, 2016

(65) Prior Publication Data
US 2018/0074416 A1    Mar. 15, 2018

(30) Foreign Application Priority Data
Mar. 24, 2015    (EP) .................................... 15160525

(51) Int. Cl.
G03F 7/20    (2006.01)

(52) U.S. Cl.
CPC .......... G03F 7/70858 (2013.01); G03F 7/709 (2013.01); G03F 7/70341 (2013.01);
(Continued)

(58) Field of Classification Search
CPC ............. G03F 7/70341; G03F 7/70716; G03F 7/70758; G03F 7/70875; G03F 7/70891; G03F 7/709
(Continued)

(56) References Cited

U.S. PATENT DOCUMENTS 5,231,291 A * 7/1993 Amemiya ............... G03F 7/707
250/440.11
5,315,154 A   5/1994 Elwell
(Continued)

FOREIGN PATENT DOCUMENTS

DE    102004062582    7/2006
EP    0 411 916        2/1991
(Continued)

OTHER PUBLICATIONS

Written Opinion issued in corresponding Singapore Patent Application No. 11201707040P dated Dec. 15, 2017.
(Continued)

*Primary Examiner* — Colin Kreutzer
(74) *Attorney, Agent, or Firm* — Pillsbury Winthrop Shaw Pittman, LLP

(57) ABSTRACT

A lithography apparatus includes: a projection system configured to project a desired image onto a substrate; an active module that generates a time-varying heat load; a temperature conditioning system configured to maintain a component of the lithography apparatus at a predetermined target temperature; and a heat buffer including a phase change material in thermal contact with the active module, the phase change material having a phase change temperature such that the phase change material is caused to undergo a phase change by the time-varying heat load, and wherein the phase change material is stationary relative to the projection system during critical operations of the lithography apparatus.

21 Claims, 6 Drawing Sheets

(52) U.S. Cl.
CPC ...... *G03F 7/70716* (2013.01); *G03F 7/70758* (2013.01); *G03F 7/70875* (2013.01); *G03F 7/70891* (2013.01)

(58) Field of Classification Search
USPC .......................................................... 355/30
See application file for complete search history.

(56) References Cited

U.S. PATENT DOCUMENTS

| | | |
|---|---|---|
| 6,397,618 B1 | 6/2002 | Chu et al. |
| 7,528,349 B1 | 5/2009 | Gotkis et al. |
| 2002/0033247 A1 | 3/2002 | Neuschutz et al. |
| 2003/0179377 A1* | 9/2003 | Masaki ............... G03F 7/70233 356/400 |
| 2004/0145048 A1 | 7/2004 | Frisch et al. |
| 2005/0128448 A1* | 6/2005 | Box .................. G03F 7/70875 355/53 |
| 2005/0128449 A1 | 6/2005 | Phillips |
| 2006/0086096 A1 | 4/2006 | Ghoshal |
| 2008/0024743 A1* | 1/2008 | Kruit ................. G03F 7/70875 355/30 |
| 2008/0073563 A1 | 3/2008 | Novak et al. |
| 2011/0310368 A1* | 12/2011 | Schmitz ................ G02B 7/008 355/53 |
| 2013/0140372 A1 | 6/2013 | Mahadeswaraswamy et al. |

FOREIGN PATENT DOCUMENTS

| | | |
|---|---|---|
| JP | 2001035764 | 2/2001 |
| JP | 2002057262 | 2/2002 |
| JP | 2005523676 | 8/2005 |
| JP | 2007514319 | 5/2007 |
| JP | 2008311595 | 12/2008 |
| JP | 2009027006 | 2/2009 |
| WO | 2014/067802 | 2/1991 |
| WO | 2005/036587 | 4/2005 |
| WO | 2014/083143 | 6/2014 |

OTHER PUBLICATIONS

International Search Report for corresponding International Patent Application No. PCT/EP2016/053228 dated May 9, 2016.
English Translation of Office Action issued in corresponding Taiwanese Patent Application No. 105106809 dated Jan. 18, 2017.
Japanese Office Action issued in corresponding Japanese Patent Application No. 2017-545737, dated Sep. 18, 2018.

* cited by examiner

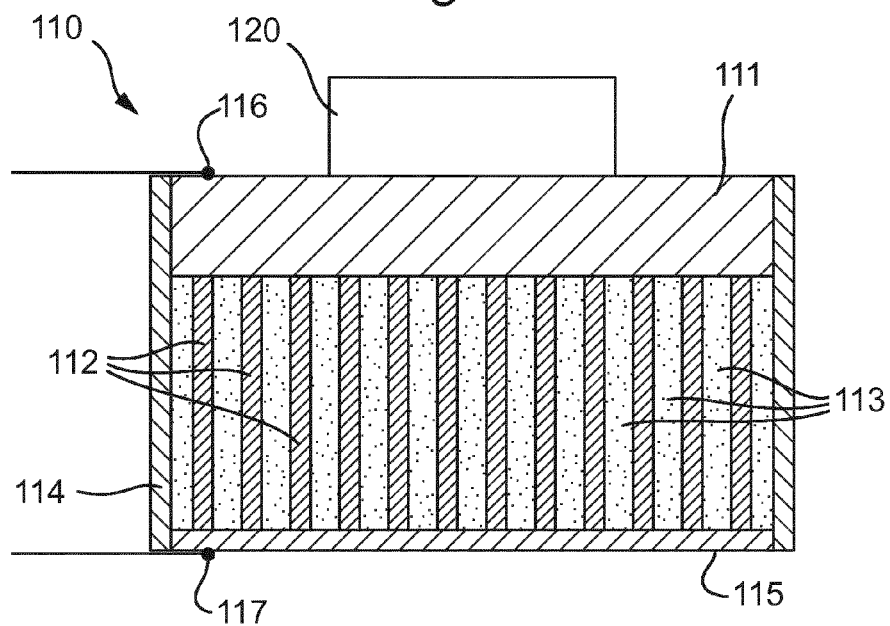
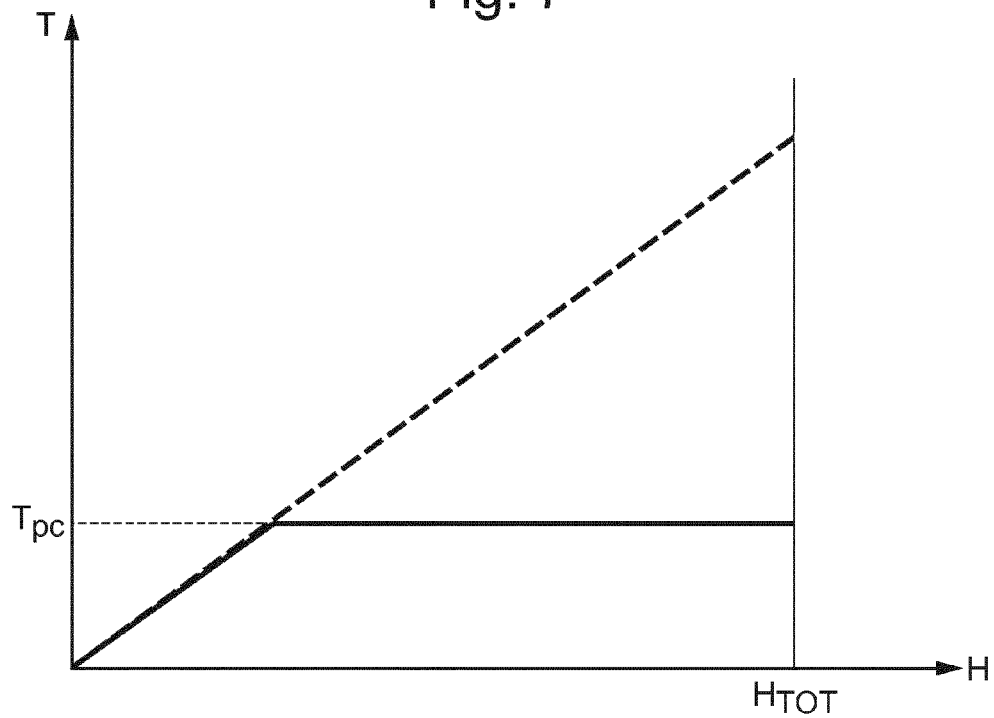

LITHOGRAPHY APPARATUS AND A METHOD OF MANUFACTURING A DEVICE

CROSS-REFERENCE TO RELATED APPLICATIONS

This application is the U.S. national phase entry of PCT patent application no. PCT/EP2016/053228, which was filed on Feb. 16, 2016, which claims the benefit of priority of European patent application no, 15160525.0, which was filed on Mar. 24, 2015, and which is incorporated herein in its entirety by reference.

FIELD

The present invention relates to a lithography apparatus and a method of manufacturing a device using a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs).

In the semiconductor industry there is a strong pressure to increase the density of devices, e.g. transistors, in an integrated circuit that is formed on a substrate. To achieve increased densities, the accuracy and precision of lithography apparatuses and processes must be improved. Amongst other things, it is therefore desirable to improve the accuracy and stability of temperature control within a lithography apparatus or an inspection tool.

Within a lithography apparatus there are various modules which generate heat loads, referred to herein as active modules. Some active modules generate heat loads that are highly variable with time, for example are intermittent. A temperature control system in a lithography apparatus may operate by circulating a thermal transfer fluid, e.g. water, through a conduit close to or in a component whose temperature is to be controlled. The component whose temperature is to be controlled may or may not be part of an active module. The temperature of the thermal transfer fluid is accurately controlled by a temperature control device, e.g. including a heater or a cooler.

If a tight specification for the size and duration of a deviation from the target temperature is set, then the temperature control system has to be capable of removing heat from the vicinity of a an active module at a rate approximately equal to the peak heat load of the active module. For a given thermal transfer fluid, the mass flow rate required to achieve a desired rate of heat removal is determined by the specific heat capacity of the thermal transfer fluid. Even using water as the thermal transfer fluid—since water has a high specific heat capacity—the large number of active modules in a lithographic apparatus means that the total required mass flow rate of the thermal transfer fluid is high.

SUMMARY

An inevitable consequence of circulating a thermal transfer fluid at a high mass flow rate is the generation of vibrations. Although measures may be taken to dampen vibrations and/or to make the lithography apparatus insensitive to vibrations, vibrations can still have detrimental effects on the projection of an image of a desired pattern onto a substrate and/or on the measurement of properties of a substrate. For example, vibrations can lead to positioning errors, known as overlay.

It is therefore desirable to provide an arrangement for controlling the temperature of a component of a lithography apparatus that avoids or reduces the generation of vibrations.

According to an aspect of the invention, there is provided a lithography apparatus comprising: a projection system configured to project a desired image onto a substrate; an active module that generates a time-varying heat load; a temperature conditioning system configured to maintain a component of the lithography apparatus at a predetermined target temperature; and a heat buffer comprising a phase change material in thermal contact with the active module, the phase change material having a phase change temperature such that the phase change material is caused to undergo a phase change by the time-varying heat load; and wherein the phase change material is stationary relative to the projection system during critical operations of the lithography apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 schematically depicts a heat buffer useable in embodiments;

FIG. 7 is a graph of temperature versus heat input in a heat buffer according to an embodiment;

DETAILED DESCRIPTION

Figure 1:
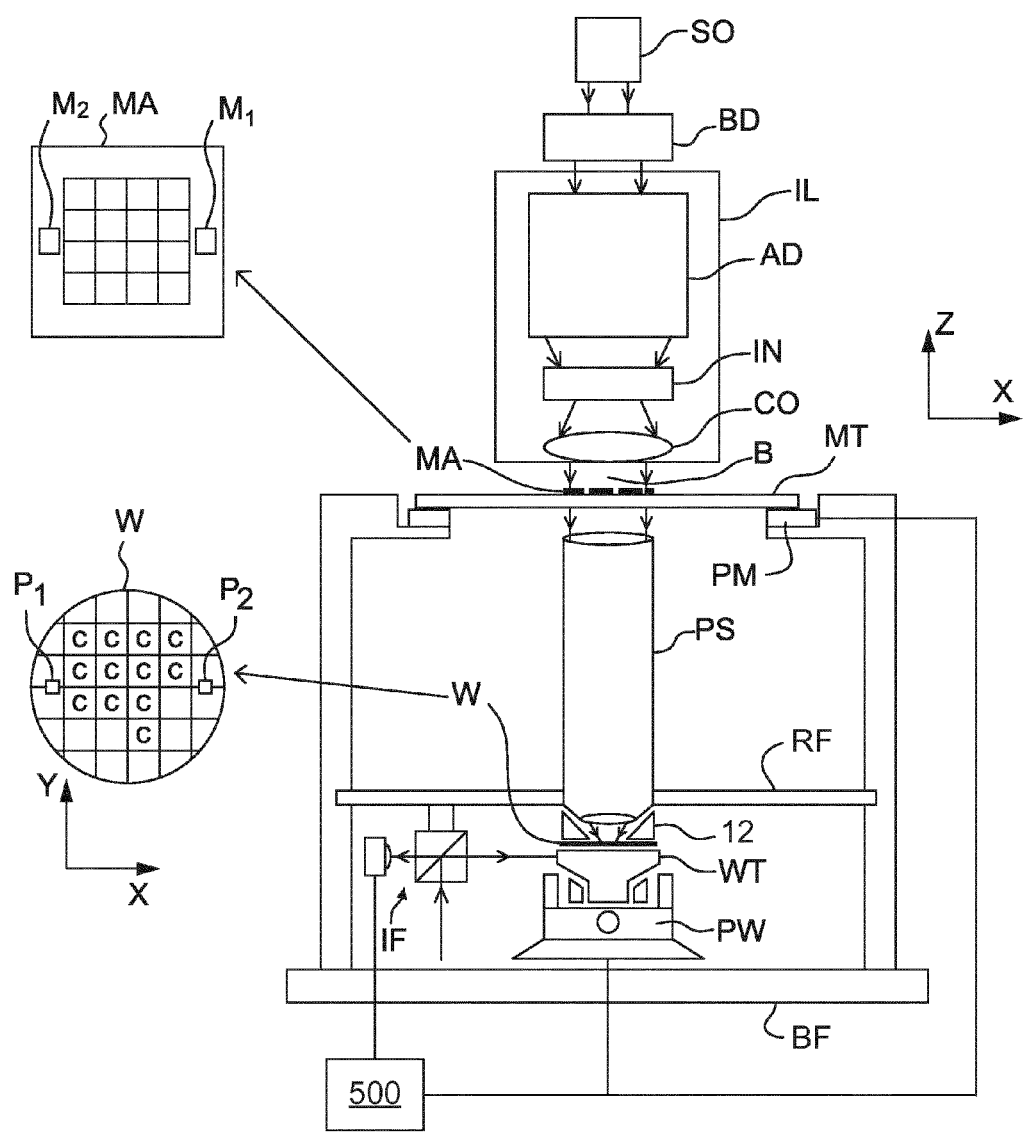
FIG. 1 schematically depicts a lithography apparatus.

FIG. 1 schematically depicts a lithography apparatus according to one embodiment. The apparatus includes an illumination system (illuminator) IL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device MA in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate W in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stage" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid. Although an immersion type lithography apparatus is described as an exemplary embodiment, the present invention also applies to non-immersion lithography apparatus.

Referring to FIG. 1, the illuminator IL receives a radiation beam from a radiation source SO. The radiation source SO and the lithography apparatus may be separate entities, for example when the radiation source SO is an excimer laser. In such cases, the radiation source SO is not considered to form part of the lithography apparatus. In arrangements where the radiation source SO is separate from the lithography apparatus, the radiation beam is passed from the radiation source SO to the illuminator IL with the aid of a beam delivery system BD including, for example, suitable directing mirrors and/or a beam expander. In other cases the radiation source SO may be an integral part of the lithography apparatus, for example when the radiation source SO is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam, to have a desired uniformity and intensity distribution in its cross-section. Similarly to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam B having been patterned by the patterning device MA may be referred to as a patterned beam. Having traversed the patterning device MA, the projection beam B passes through the projection system PS, which focuses the beam onto a target portion C of the substrate W. With the aid of the second positioning device PW and position sensor IF (e.g. an interferometric device, encoder or capacitive sensor), the substrate table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the support structure MT may be connected to a short-stroke actuator only, or may be fixed.

The patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The projection system PS is mounted on a reference frame RF (which may also be referred to as a metrology frame). The projection system can be fixed in position relative to the reference frame RF or mounted using active mounts that prevent transmission of vibrations to the projection system. The reference frame may also carry measurement systems—such as interferometric position measuring systems, alignment sensors or level sensors—and/or targets—such as grid plates or mirrors—for measurement systems.

The lithography apparatus further includes a lithography apparatus control unit 500 which controls all the movements and measurements of the various actuators and sensors described. The lithography apparatus control unit 500 also includes signal processing and data processing capacity to implement desired calculations relevant to the operation of the lithography apparatus. In practice, the lithography apparatus control unit 500 will be realized as a system of many sub-units, each handling the real-time data acquisition, processing and control of a subsystem or component within the lithography apparatus. For example, one processing subsystem may be dedicated to servo control of the second positioning device PW. Separate units may handle different actuators, or different axes. Another sub-unit might be dedicated to the readout of the position sensor IF. Overall control of the lithography apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate W can be classed into three general categories. These are the bath type arrangement, the so-called localized immersion systems and the all-wet immersion systems. An embodiment of the present invention relates particularly to the localized immersion systems.

In an arrangement which has been proposed for a localized immersion system a liquid confinement structure 12 extends along at least a part of a boundary of an immersion space 10 between the final optical element FE of the projection system PS and the facing surface of the stage or table facing the projection system PS. The facing surface of the table is referred to as such because the table is moved during use and is rarely stationary. Generally, the facing surface of the table is a surface of a substrate W, substrate table WT which surrounds the substrate W or both. Other arrangements for providing liquid between a final optical element of the projection system and the substrate can be used in an embodiment of the invention.

A known lithography apparatus includes a temperature conditioning system to effect highly precise temperature control of components of a lithography apparatus and also the path of the projection beam. Temperature control is provided: to prevent thermal expansion or contraction of components whose dimensions and/or shape are critical; to minimise or reduce temperature variations of the substrate being exposed; and to minimise or reduce variations in the refractive index of media traversed by radiation beams, such as those traversed by the projection beam or by measurement beams. For example, in a lithography apparatus, which implements a localized immersion system, the media traversed by the projection beam include the immersion liquid between the substrate and the last lens element of the projection system. As well as controlling the temperature of gasses (e.g. extremely clean dry air) within the lithography apparatus, a known approach to temperature control is to circulate a thermal transfer fluid (e.g. water) through conduits in various components of the lithography apparatus. The circulation of thermal transfer fluid may control the temperature of an adjacent component, as well as controlling the temperature of a component in which a conduit is provided. To meet very tight temperature specifications, the thermal transfer fluid is often circulated at high rates of flow, which may generate undesirable vibrations.

A lithography apparatus includes many sources of heat, which generate respective heat loads. One significant heat load is absorption of radiation of the projection beam by the substrate and/or optical components. Other heat loads include waste heat generated by active components, such as actuators and electronic circuits. The temperature control system is desirably capable of removing heat at the same rate as it is generated within the lithography apparatus.

Although the numerous heat loads within a lithography apparatus include many heat loads that are highly variable with time, it has been conventional to provide a temperature conditioning system that is capable of removing heat from the apparatus at a rate equal to the sum of all of the peak heat loads of all the different heat sources within the lithography apparatus. (A negative heat load is possible, for example evaporation of immersion liquid can remove heat from a specific position within the lithography apparatus, but such negative heat loads are generally few in number). This is because it is not generally possible to predict exactly when the different time-varying heat loads within a lithography apparatus will generate heat at their peak rates and so the temperature conditioning system is specified to have a capacity capable of removing the heat generated in the lithography apparatus if all of the time-varying heat loads were to peak simultaneously. In this regard, it should be noted that it is a requirement for some parts of the lithographic apparatus never to depart from the target temperature by more than a narrow limit since irreversible shape changes may occur due to thermal expansion. Certain parts of a lithographic apparatus will commonly also have a very tight specification on short term temperature changes. Longer term temperature changes can be compensated for by calibration, but changes over a time period of the order of 10 seconds to 20 seconds during critical operations can cause uncorrectable errors in measurements.

Since the capacity of the temperature conditioning system to remove heat from the system is determined by the specific heat capacity and mass flow rate of a thermal transfer fluid used, ensuring the temperature conditioning system can remove heat at a rate equal to the total of the peak loads means that the thermal transfer fluid must be circulated at a high mass flow rate. A high mass flow rate can result in the generation of vibrations within the lithography apparatus which can be detrimental to its performance, e.g. by causing positioning errors. Since it is rare that the time-varying heat loads in the lithography apparatus will generate heat at their peak rates simultaneously, the temperature conditioning system will be under-utilised for most of the time.

An embodiment of the present invention is a lithography apparatus comprising a projection system configured to project a desired image onto a substrate. The lithography apparatus also has an active module that generates a time-varying heat load and a temperature conditioning system configured to maintain a part of the lithographic system at a predetermined target temperature. A heat buffer comprising a phase change material in thermal contact with the active module is provided. The phase change material has a phase change temperature such that the phase change material is caused to undergo a phase change by the time varying heat load. The phase change material is stationary relative to the projection system during critical operations of the lithography apparatus.

In an embodiment, it is therefore possible to reduce the vibrations in the lithography apparatus because the heat buffer absorbs heat by a phase change during peak heat generating periods of the active module and then releases it more slowly. In an embodiment, the phase change temperature is sufficiently close to the predetermined temperature (which is, e.g., about 22° C.) that the temperature of the phase change material rises enough due to the time-varying heat load to undergo a phase change. In effect, the magnitude of the peak heat output of the active module is moderated. Therefore, the temperature conditioning system can be provisioned to have a lower maximum heat removal capability and thus can employ reduced mass flow rates of a thermal transfer fluid. Alternatively, a temperature conditioning system capable of a high heat removal capacity can be operated with a reduced mass flow rate of its thermal transfer fluid. Alternatively or in addition, a branch of a cooling system otherwise required to cool the active module may be omitted.

At the same time, because the phase change material is stationary during critical operations of the lithography apparatus, the phase change material does not itself introduce further vibrations into the apparatus. A phase change material that is in motion can generate vibrations in the apparatus due to agitation thereof. Such vibrations may be particularly unpredictable since the phase, or the ratio of phases, of the phase change material at a particular point in time may be unpredictable.

Critical operations of the lithography apparatus include the projection of a desired pattern onto a substrate in order to expose a radiation sensitive layer thereon. Such operations may be referred to as exposures. Other critical operations may include measurements of properties of a substrate that is to be or has been exposed. Such properties may include the relative positions of alignment markers on the substrate to each other and/or fiducials on a substrate table. This operation may be referred to as alignment. Other properties of the substrate that can be measured during critical operations include the surface contour of the substrate and/or the distance between the surface of the substrate and a projection system, which may be referred to as levelling.

Figure 2:
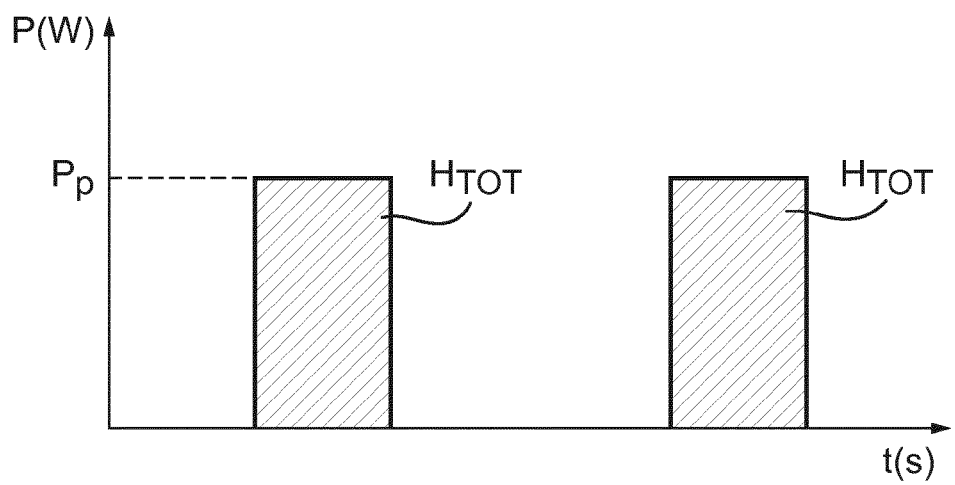
FIG. 2 is a graph of heat output versus time in an active module of an embodiment.

In an embodiment, the active module operates intermittently to perform a predetermined operation. As shown in FIG. 2, which is a graph of heat output P (e.g., in Watts) of the active module as a function of time "t" (e.g., in seconds), the active module generates heat at a rate $P_p$ for a certain period of time corresponding to its period of operation. The total heat output $H_{TOT}$ during the period of operation (here: a single operational cycle) is represented by the area under the line in the graph. That is, the total heat output $H_{TOT}$ per operational cycle is the time integral of the heat output P over time during a single operational cycle. The heat output during the period of operation of the active module is shown as constant for simplicity but may, in general, be variable. The period of operation may repeat at regular intervals or irregularly for example depending on operations performed by the lithography apparatus. It is desirable that the heat buffer captures at least 75% of the total heat output $H_{TOT}$. If the heat buffer can capture at least 75% of the heat generated in one period of operation of the active module, then a substantial reduction of the peak temperature occurring in the vicinity of the active module can be achieved. The heat buffer is placed in close thermal contact with the active module to ensure the heat output by the active module is captured. Insulation can be provided to prevent heat escaping form the active module to other parts of the lithography apparatus than the heat buffer.

In an embodiment, the active module and heat buffer form a substantially thermally isolated system structured so that the preferential path for heat generated by the active module to escape from the thermally isolated system is through the heat buffer. The thermally isolated structure is arranged such that the rate of heat outflow therefrom is less than the peak heat generation rate of the active module. Desirably the rate of heat outflow is less than 20% or less than 10% of the peak heat generation rate of the active module.

It is also desirable that the heat buffer comprises sufficient phase change material to absorb by latent heat of phase transition all of the captured heat and more desirably at least two or three times the total heat output $H_{TOT}$. If the heat buffer can absorb the heat captured in several periods of operation of the active module it can be ensured that all captured heat is absorbed even in unusual circumstances such as when the active module is being operated several times in quick succession or if the removal of heat from the vicinity of the active module is impaired.

In an embodiment the temperature conditioning system is configured to remove heat from the active module at a predetermined heat removal rate $P_r$ but the time-varying heat load has a peak heat generation rate $P_p$ that is greater than the predetermined heat removal rate, but only at certain times.

Figure 3:
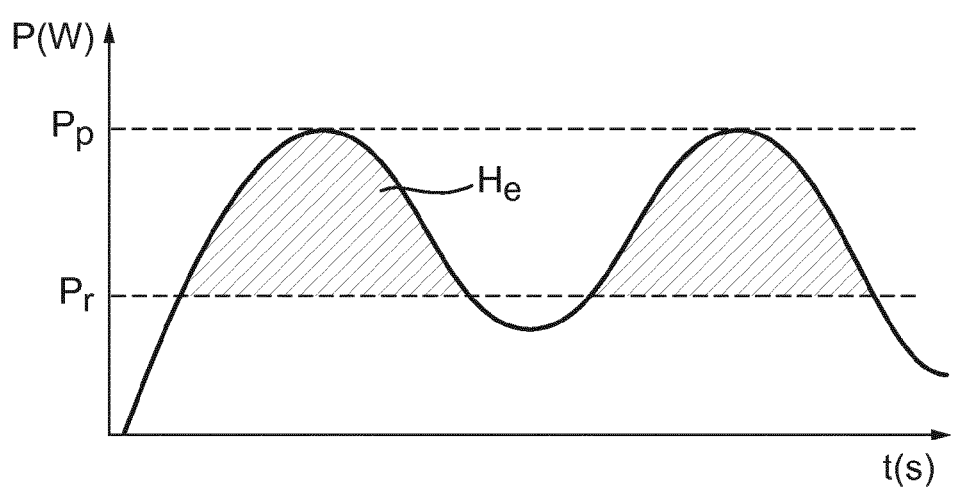
FIG. 3 is a graph of heat output versus time in another active module of an embodiment.

Similar considerations apply if the time-varying heat load $P_p$ is cyclic, with a regular predetermined period in which it has a peak heat generation rate, or irregular, with the peak heat generation rate occurring at irregular intervals. A period when the active module is generating heat at a rate greater than the predetermined heat removal rate $P_r$ is referred to as a period of excess heat generation. This is shown in FIG. 3 which is a graph of heat output P of the active module as a function of time t. The heat excess $H_e$ is the total amount of heat generated by the active module in excess of the heat removal rate $P_r$ during a period of excess heat generation. Desirably the heat buffer captures at least 75% of the greatest expected heat excess. Desirably the heat buffer comprises sufficient phase change material to absorb by phase transition at least two to three times the greatest expected heat excess.

In an embodiment, the active module includes an actuator, for example a rotary electric motor or a linear motor. An actuator may generate a significant amount of waste heat in its operation. In an embodiment of the present invention, the active module includes a power electronic device, for example a power amplifier or a power transistor. A power electronic device may generate a substantial amount of waste heat in its operation.

In an embodiment, the heat buffer comprises a heat transfer member in thermal contact with the active module and the phase change material. The heat transfer member provides a preferential path for the heat generated by the active module toward the phase change material so as to prevent the heat generated by the active module dispersing in the surroundings thereof. Desirably, the heat transfer member has a plurality of fins in contact with the phase change material so as to maximise the area of contact with the phase change material. The provision of fins improves heat transfer into the phase change material even when the phase change material has a low thermal conductivity.

An embodiment of the invention is a lithography apparatus comprising: a reference frame; a projection system mounted on the reference frame and configured to project a desired image onto a substrate; an active module that generates a time-varying heat load; a temperature conditioning system configured to maintain the reference frame at a predetermined target temperature; and a heat buffer comprising a phase change material in thermal contact with the active module and the reference frame, the phase change material having a phase change temperature such that the phase change material is caused to undergo a phase change by the time-varying heat load; wherein at least 75% of the heat load generated by the active module flows to the heat buffer and then to the reference frame.

It would normally be thought undesirable to direct a time-varying heat load to the reference frame of a lithography apparatus, which has to be kept thermally stable to provide a highly stable reference for measurement systems included in the lithography apparatus. However, by directing the heat load generated by the active module through a heat buffer including a phase change material, the maximum temperature change (excursion) and rate of temperature change (drift) can be controlled to within acceptable limits, e.g., by having another thermal conditioning system control the temperature of the reference frame. The reference frame receives then a more steady heat load of a lower magnitude, the effects of which can be calibrated away or can be handled more effectively by the other thermal conditioning system.

In an embodiment, the heat buffer can be arranged to delay the flow of heat to the surroundings (e.g. to the reference frame) so that the heat captured by the heat buffer during one cycle of operation of the active module flows out of the heat buffer during a period at least five times, desirably ten times, the period of operation of the active module. For example, an active module might operate for a period of, say, 10 seconds every hour and the heat buffer releases the heat captured during that period over the course of a minute or more.

Figure 4:
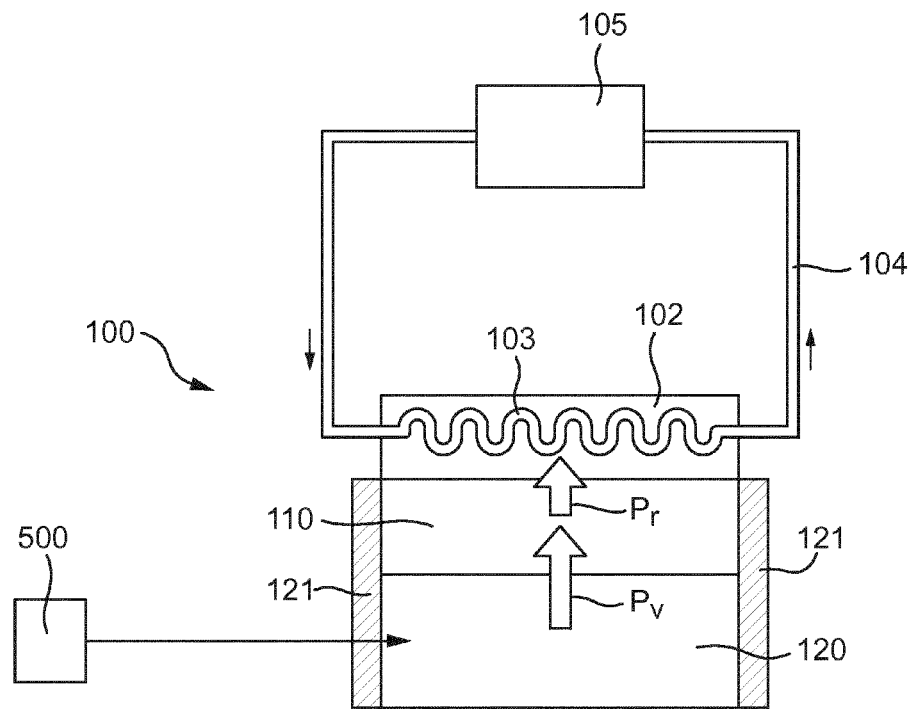
FIG. 4 schematically depicts a temperature conditioning system with a heat buffer according to an embodiment.

A specific embodiment is schematically depicted in FIG. 4. An active module 120 of a lithography apparatus is controlled to operate variably or intermittently by the control system 500. As a result of its variable or intermittent operation a variable heat load $P_v$ is generated. The variable heat load $P_v$ varies up to a maximum rate referred to herein as the peak heat generation rate $P_p$. The heat generated by active module 120 is absorbed within heat buffer 110 by a phase change material which undergoes a phase change, e.g. from solid to liquid.

The phase change material is chosen or modified so that the temperature of the phase change $T_{pc}$ is close to but above a desired target temperature $T_r$ at which the lithography apparatus, or the relevant component to be thermally conditioned, is to be maintained. The temperature of the phase change $T_{pc}$ is such that the heat generated by the active module is sufficient to cause the phase change material to reach the temperature of the phase change $T_{pc}$ and for at least some of the phase change material to undergo the phase change. In an embodiment, the temperature of the phase change $T_{pc}$ is greater than the desired target temperature $T_r$ by less than 5 K, more desirably by less than 3 K, more desirably by less than 2 K. In an embodiment, the desired target temperature $T_r$ is about 295 K. Suitable phase change materials include paraffins, fatty acids and polyethylene glycols. These materials can have melting points in the range of from about 290 K to about 310 K. The temperature of the phase change can be determined to a desired value by control of the exact formulation of the material. These materials may have a latent heat in the range of from about 100 to about 300 kJ/kg. A higher latent heat is desirable as it allows more heat to be absorbed by a given quantity of the phase change material.

The effect of the heat buffer is illustrated in FIG. 7 which shows temperature "T" of the phase change material versus heat input "H" to the heat buffer. Initially as the input heat rises so does the temperature of the phase change material, with the slope of the temperature rise being determined by the specific heat capacity of the phase change material and other parts of the buffer. However, when the temperature of the phase change $T_{pc}$ is reached, further heat input to the heat buffer causes the phase change material to progressively change phase, but without any further increase in temperature, until all of the phase change material has undergone the phase change. Therefore, the temperature of the heat buffer remains substantially constant. The heat buffer can be seen as acting as a temperature limiter at least until all phase change material has undergone the phase change.

Returning to the diagram of FIG. 4, a temperature conditioning system 100 is provided to remove heat from the heat buffer 110 at a heat removal rate $P_r$. The heat removal rate $P_r$ is less than the peak heat generation rate $P_p$ of the variable heat load $P_v$ but greater than or equal to the long term average of the variable heat load $P_v$. Temperature conditioning system 100 comprises a heat conductive member 102 provided with a conduit 103 through which a thermal transfer fluid 104 is circulated. A cooler 105 maintains the thermal transfer fluid 104 at the desired target temperature $T_r$. In an embodiment, heat conductive member 102 is a part of another component of the lithography apparatus, e.g. a reference frame, and may have a significant heat capacity.

Desirably the heat buffer 110 is in close thermal contact with the active module 120 and the thermal contact may be enhanced by ensuring a close physical contact and/or by the use of thermal grease. Additionally, it is possible to provide insulating material 121 to surround active module 120 and heat buffer 110 so that active module 120 and heat buffer 110 form a thermally isolated system. Insulating material 121 can be made, for example, of polyoxymethylene (POM).

Figure 5:
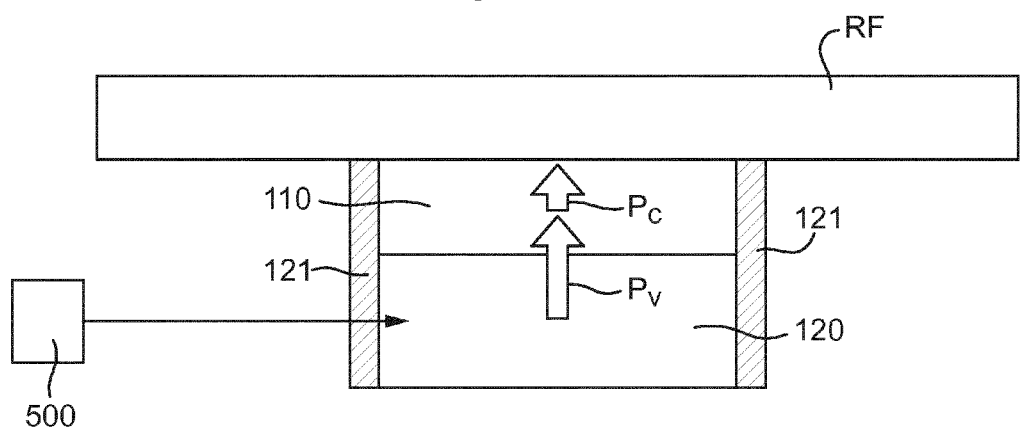
FIG. 5 schematically depicts a temperature conditioning system with a heat buffer according to an embodiment.

Another embodiment is depicted schematically in FIG. 5. The embodiment of FIG. 5 is essentially the same as the embodiment of FIG. 4 except as noted below and a description of common parts is not repeated for brevity.

In the embodiment of FIG. 5, the temperature conditioning system 100 is not provided and the heat buffer 110 is instead placed in thermal contact with a part of the lithography apparatus having a large thermal mass, for example the reference frame RF. The contact between heat buffer 110 and reference frame RF (or other part of the lithography apparatus) is arranged so that heat is conducted out of the heat buffer 110 at a heat conduction rate $P_c$ that is less than the peak heat generation rate but greater than or equal to the long term average of the variable heat load $P_v$. The reference frame RF (or other part of the lithographic apparatus) has a sufficiently large heat capacity that its temperature does not change at greater than an acceptable rate, i.e. temperature drift is limited. Desirably the temperature does not deviate by more than an acceptable amount due to the heat received from the heat buffer 110.

FIG. 6 shows schematically a heat buffer 110 useable in an embodiment. Heat buffer 110 comprises a heat transfer member 111 made of a material, such as aluminium or copper, having a high thermal conductivity. The heat transfer member 111 is placed in contact with the active module 120 in order to conduct heat away therefrom. Heat buffer 110 further includes a plurality of fins 112 in thermal contact with and extending away from the heat transfer member 111. Between the fins 112 is the phase change material 113. The phase change material 113 is confined by side walls 114, the heat transfer member 111 and cover plate 115. In an embodiment, side walls 114 are thermally insulating e.g. made of POM. In an embodiment, cover plate 115 is made of a thermally conductive material, such as aluminium or copper, so that heat can be conducted away from the phase change material, e.g. to temperature conditioning system 100 or reference frame RF (or other part of the lithography apparatus). The cover plate 115 can be made partially insulating and partially conductive in order to control the rate of heat transfer away from heat buffer 100. The fins 112 serve to conduct heat more quickly to all parts of the phase change material, even if the phase change material itself has a relatively low thermal conductivity.

In an embodiment, temperature sensors 116 and 117 are provided to monitor the temperature of the input and output sides respectively. Temperature sensor 116 may be attached to the heat transfer member 111. Temperature sensor 117 may be attached to cover plate 115. Temperature sensors 116 and 117 may be thermocouples for example. Temperature sensors 116 and 117 provide sufficient information to monitor the functioning of the heat buffer 110, for example to verify that it contains sufficient phase change material and that the heat absorbed is sufficient to raise the temperature above the temperature of the phase change $T_{pc}$.

Phase change material 113 may undergo expansion during the phase change, e.g. from solid to liquid or vice versa. Parts of the heat buffer, e.g. side walls 114, can be made flexible in order to accommodate such expansion, which is of a predictable amount. Alternatively or in addition, the heat buffer 110 can be underfilled under vacuum conditions so that there is sufficient space within heat buffer 110 to allow expansion of the phase change material 113.

Figure 8:
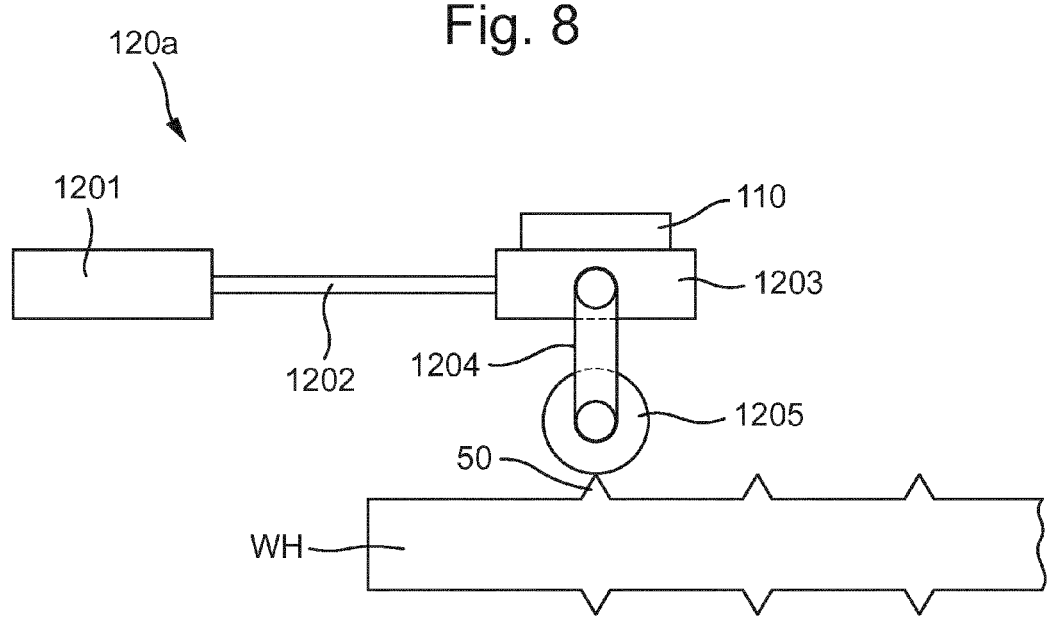
FIG. 8 depicts a substrate table cleaning module in an embodiment.

FIG. 8 is a more detailed schematic view of an active module in an embodiment. In the case of FIG. 8, the active module 120A is a substrate holder cleaning module. Substrate holder cleaning module 120A comprises a base unit 1201 supporting an extendable boom 1202. Normally the extendable boom is retracted so that it does not obstruct movement of the substrate table. The substrate stage cleaning device may be provided at a measurement stage of a dual-stage lithography apparatus, e.g. at a substrate loading/unloading station. At the end of extendable boom 1202 is a motor unit 1203 connected via drive chain 1204 to cleaning wheel 1205. Periodically the substrate holder cleaning module 120A is used to clean one or more burls 50 provided on substrate holder WH. When the extendable boom is extended and the cleaning wheel is driven, the substrate holder is moved so that a burl to be cleaned is positioned under the cleaning wheel. During a burl cleaning operation, a predictable amount of waste heat is generated by motor 1203. A heat buffer 110 is provided in close thermal contact with motor 1203 in order to absorb the waste heat generated during the burl cleaning operation.

In an embodiment, the substrate holder cleaning module is operated in a first mode in which each cleaning operation cleans a small number of burls, e.g. from one to five burls, and takes a short period of time e.g. from 20 to 100 seconds. The cleaning operation may be carried out a predetermined number, e.g. from 5 to 40, times per day. In an embodiment, the substrate holder cleaning module 120A can be operated in a second mode in which the entire substrate holder is cleaned. The second mode cleaning operation may take between 5 and 10 minutes and may be carried out relatively infrequently, e.g. at a frequency from about one time per week to about three times per day.

In an embodiment, heat buffer 110 provided in substrate holder cleaning module 120A has a heat absorption capacity sufficient to absorb all of the waste heat $H_{TOT}$ generated during the most extensive operation performed by the substrate holder cleaning module 120A. In an embodiment this is the second mode cleaning operation which may result in a total heat dissipation of between about 200 and about 300 J. The amount of phase change material required to absorb this amount of heat depends upon the latent heat of the phase change material. For suitable materials such as salt hydrates, paraffins or polyethylene the required volume may be less than about 5 cm$^3$, even allowing a substantial margin for error. Including the other components of the heat buffer, the total volume of the heat buffer may be up to about 15 cm$^3$. Nevertheless this volume is sufficiently small that it can easy be accommodated within the space allowed for the substrate holder cleaning module.

Figure 9:
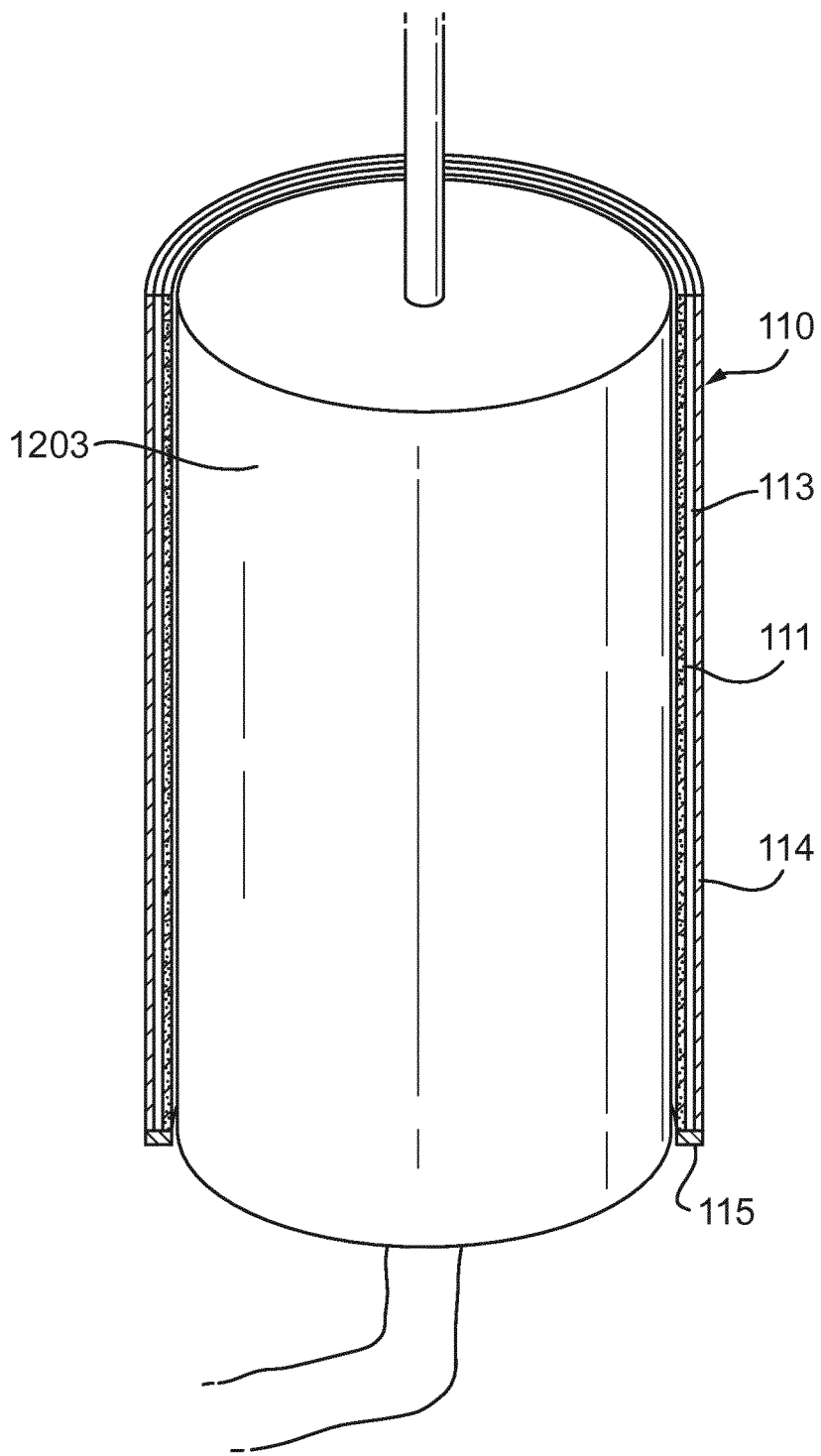
FIG. 9 depicts a motor surrounded by a heat buffer of an embodiment.

FIG. 9 shows in more detail an arrangement in which the heat buffer 110 is provided in the form of a cylindrical jacket closely surrounding motor 1203. The heat buffer 110 in such an arrangement may have a 3-layer structure with the phase change material 113 sandwiched between a heat transfer layer 111 and an outer insulating cover layer 114. An end cover 115 provides a route for the heat to be extracted from the heat buffer 110 by a temperature conditioning system and/or by conduction of another part of the lithographic apparatus. By forming the heat buffer 110 as a jacket closely surrounding the motor 1203 it is easy to ensure that substantially all waste heat generated in the motor 1203 is directed to the phase change material. The jacket creates a thermally isolated system containing the heat buffer and the motor. The shape of the jacket can be adapted to closely fit active devices of other shapes than the simple cylinder shown in FIG. 9 and to accommodate electrical connections, drive shaft outputs and mounting arrangements, etc.

Figure 10:
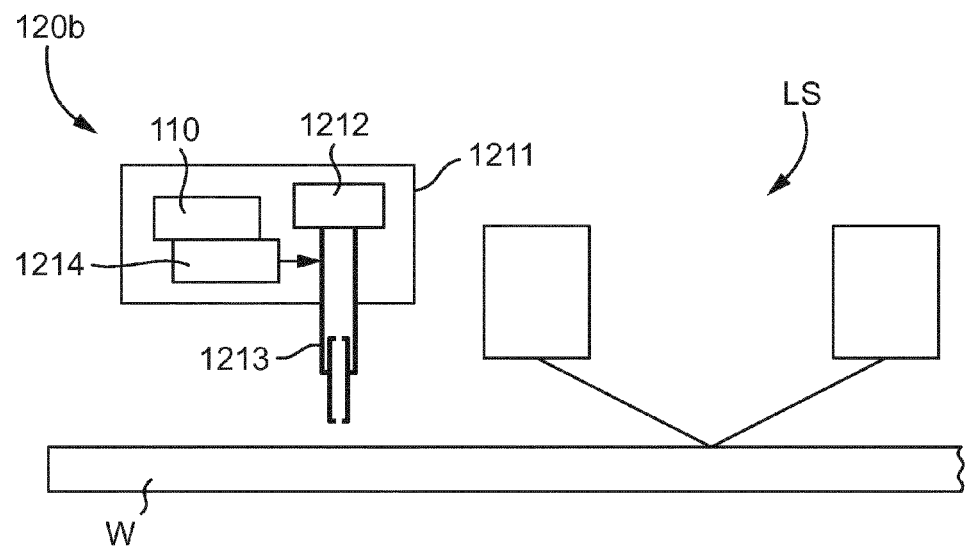
FIG. 10 schematically depicts an air gauge in an embodiment.

FIG. 10 depicts schematically another active module 120B in the form of an air-gauge. Air gauge 120B is provided at a measurement station of a dual-stage lithographic apparatus and is used for calibration of an optical level sensor LS. The optical level sensor LS is used to generate a topographical map of the upper surface of a substrate. Air gauge 120B is mounted in a compartment 1211 which is fixed to the reference frame RF (not shown in FIG. 10). Air gauge 120B includes a telescopic cylinder 1213 which is extended towards the substrate by actuator 1214, e.g. in the form of a linear motor. A pressure sensor 1212 is used to make a highly accurate measurement of the distance between the end of the telescopic cylinder 1213 and a facing surface, e.g. the upper surface of a substrate W or the substrate table WT.

When actuator 1214 is operated to extend or retract telescopic tube 1213, a small amount of waste heat is generated. In an embodiment the total amount of waste heat generated $H_{TOT}$ is in the range of from about 10 J to about 50 J. Although this seems a very small amount of energy, because of the extreme precision of the measurements to be made by air gauge 120B and level sensor LS, release of this amount of waste heat into the environment of the air gauge 120B and level sensor LS is undesirable. Even slight changes in the temperature of the gas in the environment around air gauge 120B can affect the pressure measurements made thereby. Similarly, a small change in the temperature of the gas traversed by the measurement being of the level sensor LS can result in undesirable refractive index changes that affect the measurements of level sensor LS. Other measurement systems, such as an alignment sensor and a reference sensor which measures the position of another sensor, may be provided in the vicinity of the air gauge and might be disturbed by the release of heat from actuator 1214.

Accordingly, an embodiment of the present invention provides a heat buffer 110 in close thermal contact to actuator 1214. In view of the small amount of waste heat generated by actuator 1214, the total volume of phase change material provided in heat buffer 110 may be less than 1 cm³.

In an embodiment, there is provided a lithography apparatus comprising: a projection system configured to project a desired image onto a substrate; an active module that generates a time-varying heat load; a temperature conditioning system configured to maintain a component of the lithography apparatus at a predetermined target temperature; and a heat buffer comprising a phase change material in thermal contact with the active module, the phase change material having a phase change temperature such that phase change material is caused to undergo a phase change by the time-varying heat load, wherein the phase change material is stationary relative to the projection system during critical operations of the lithography apparatus.

In an embodiment, the critical operations include projection of the desired pattern onto the substrate and measurement of a property of the substrate. In an embodiment, the active module is configured to perform a predetermined operation; and the heat buffer is arranged to capture at least 75% of a total heat output by the active module during the predetermined operation. In an embodiment, the heat buffer comprises sufficient phase change material to absorb by latent heat of phase change at least two times the total heat output by the active module during the predetermined operation. In an embodiment, the temperature conditioning system is capable of removing heat from the active module at a predetermined heat removal rate, the time-varying heat load includes an excess heat generation period in which heat is generated at a rate greater than the predetermined heat removal rate, and the heat buffer is arranged to capture at least 75% of the heat generated by the active module in excess of the predetermined heat removal rate during the excess heat generation period. In an embodiment, the heat buffer comprises sufficient phase change material to absorb by latent heat of phase change at least two times the heat generated by the active module in excess of the predetermined heat removal rate during the excess heat generation period. In an embodiment, the active module includes an actuator and/or a power electronic device, a substrate stage cleaner or an air gauge. In an embodiment, the active module and the heat buffer are located within a thermally isolated system such that the rate of heat outflow from the thermally isolated system is less than a peak value of the time-varying heat load. In an embodiment, the phase change is a transition from solid to liquid. In an embodiment, the heat buffer further comprises a heat transfer member in thermal contact with the active module and the phase change material. In an embodiment, the heat transfer member has a plurality of fins in contact with the phase change material. In an embodiment, the active module is mounted on the component of the lithography apparatus. In an embodiment, the component of the lithography apparatus is a frame of the lithography apparatus. In an embodiment, the lithography apparatus further comprises a thermal insulator particularly surrounding the active module and the heat buffer.

In an embodiment, there is provided a device manufacturing method using a lithography apparatus having a projection system and an active module, the method comprising: operating the active module so that a time-varying heat load is generated; absorbing the time-varying heat load in a heat buffer comprising a phase change material by the phase change material undergoing a phase change; removing heat for the heat buffer at a lower rate than a peak heat generation rate of the active module; and projecting desired image into a substrate using the projection system, wherein the phase change material is stationary relative to the projection system during the projecting.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A lithography apparatus comprising:
a projection system configured to project a desired image onto a substrate;
an active module configured to generate a time-varying heat load;
a temperature conditioning system configured to maintain a component of the lithography apparatus at a predetermined target temperature; and
a heat buffer comprising a structure separate from and in contact with the temperature conditioning system, the structure comprising a phase change material in thermal contact with the active module, the phase change material having a phase change temperature such that the phase change material is caused to undergo a phase change by the time-varying heat load,
wherein the temperature conditioning system and heat buffer are configured such that heat is removed from the heat buffer at a lower rate than a peak heat generation rate of the active module.

2. The lithography apparatus according to claim 1, wherein, during normal operation of the lithography apparatus, the phase change material is stationary relative to the projection system during projection of the desired pattern onto the substrate, during measurement of a property of the substrate, and during positioning of the substrate for the projection and the measurement.

3. The lithography apparatus according to claim 1, wherein the active module is configured to perform a predetermined operation; and the heat buffer is arranged to capture at least 75% of a total heat output by the active module during the predetermined operation.

4. The lithography apparatus according to claim 3, wherein the heat buffer comprises sufficient phase change material to absorb by latent heat of phase change at least two times the total heat output by the active module during the predetermined operation.

5. The lithography apparatus according to claim 1, wherein:
the temperature conditioning system is configured to remove heat from the active module at a predetermined heat removal rate;
the time-varying heat load includes an excess heat generation period in which heat is generated at a rate greater than the predetermined heat removal rate; and
the heat buffer is arranged to capture at least 75% of the heat generated by the active module in excess of the predetermined heat removal rate during the excess heat generation period.

6. The lithography apparatus according to claim 5, wherein the heat buffer comprises sufficient phase change material to absorb by latent heat of phase change at least two times the heat generated by the active module in excess of the predetermined heat removal rate during the excess heat generation period.

7. The lithography apparatus according to claim 1, wherein the active module includes an actuator and/or a power electronic device, a substrate stage cleaner or an air gauge.

8. The lithography apparatus according to claim 1, wherein the active module and the heat buffer are located within a thermally isolated system such that a rate of heat outflow from the thermally isolated system is less than a peak value of the time-varying heat load.

9. The lithography apparatus according to claim 1, wherein the phase change is a transition from solid to liquid.

10. The lithography apparatus according to claim 1, wherein the heat buffer further comprises a heat transfer member in thermal contact with the active module and the phase change material.

11. The lithography apparatus according to claim 9, wherein the heat transfer member has a plurality of fins in contact with the phase change material.

12. The lithography apparatus according to claim 1, wherein the active module is mounted on the component of the lithography apparatus.

13. The lithography apparatus according to claim 12, wherein the component of the lithography apparatus is a frame of the lithography apparatus.

14. The lithography apparatus according to claim 1, further comprising a thermal insulator particularly surrounding the active module and the heat buffer.

15. A device manufacturing method using a lithography apparatus having a projection system and an active module, the method comprising:
operating the active module so that a time-varying heat load is generated;
absorbing the time-varying heat load in a heat buffer comprising a structure separate from and in contact with a temperature conditioning system, the structure comprising a phase change material, by the phase change material undergoing a phase change;
removing heat from the heat buffer at a lower rate than a peak heat generation rate of the active module; and
projecting a desired image onto a substrate using the projection system.

16. The method according to claim 15, wherein the active module performs a predetermined operation, and the heat buffer captures at least 75% of a total heat output by the active module during the predetermined operation.

17. The method according to claim 15, wherein;
the temperature conditioning system removes heat from the active module at a predetermined heat removal rate;
the time-varying heat load includes an excess heat generation period in which heat is generated at a rate greater than the predetermined heat removal rate; and
the heat buffer captures at least 75% of the heat generated by the active module in excess of the predetermined heat removal rate during the excess heat generation period.

18. The method according to claim 15, wherein the active module and the heat buffer are located within a thermally isolated system such that a rate of heat outflow from the thermally isolated system is less than a peak value of the time-varying heat load.

19. The method according to claim 15, wherein the phase change is a transition from solid to liquid.

20. The method according to claim 15, wherein the heat buffer further comprises a heat transfer member in thermal contact with the active module and the phase change material.

21. The method according to claim 15, wherein, during normal operation of the lithography apparatus, the phase change material is stationary relative to the projection system during the projecting the desired image onto the substrate, during measurement of a property of the substrate, and during positioning of the substrate for the projecting and the measurement.

* * * * *